(12) United States Patent
Ko et al.

(10) Patent No.: US 8,193,839 B2
(45) Date of Patent: Jun. 5, 2012

(54) MULTI-LEVEL TRANSMITTER CIRCUIT HAVING SUBSTANTIALLY CONSTANT IMPEDANCE OUTPUT

(75) Inventors: Isaac Terasuth Ko, Kowloon (HK); Ka Wai Ho, Ma On Shan (HK); Wan Tim Chan, Yuen Long (HK)

(73) Assignee: SuperTex, Inc., Sunnyvale, CA (US)

( * ) Notice: Subject to any disclaimer, the term of this patent is extended or adjusted under 35 U.S.C. 154(b) by 198 days.

(21) Appl. No.: 12/786,331

(22) Filed: May 24, 2010

(65) Prior Publication Data

US 2011/0285457 A1    Nov. 24, 2011

(51) Int. Cl.
*H03B 1/00* (2006.01)
*H03K 3/00* (2006.01)
(52) U.S. Cl. .................................................. 327/112
(58) Field of Classification Search .......... 327/108, 327/112; 600/437; 326/91
See application file for complete search history.

(56) References Cited

U.S. PATENT DOCUMENTS

2009/0206676 A1 *   8/2009   Chu et al. ................... 307/106
* cited by examiner

*Primary Examiner* — Quan Tra
(74) *Attorney, Agent, or Firm* — DLA Piper LLP (US)

(57) ABSTRACT

A multi-level transmitter circuit with substantially constant output impedance has a capacitive transducer connected between a voltage input and ground. A first voltage path connects the voltage input to a first positive voltage source. The first voltage path is controlled by a first control signal. A second voltage path connects the voltage input to a second positive voltage source, less than the first positive voltage source. The second voltage path passes through a diode and is controlled by a second control signal. A third voltage path connects the voltage input to a third voltage source, less than ground, and is controlled by the second control signal. The impedance at the voltage input during the first control signal is substantially the same as the impedance at the voltage input during the second control signal.

21 Claims, 2 Drawing Sheets

MULTI-LEVEL TRANSMITTER CIRCUIT HAVING SUBSTANTIALLY CONSTANT IMPEDANCE OUTPUT

TECHNICAL FIELD

The present invention relates to a multi-level circuit for a capacitive type transducer, wherein the circuit has a substantially constant impedance output.

BACKGROUND OF THE INVENTION

Multi-level circuits for use with transducers, such as ultrasound transducer are well known in the art. Referring to FIG. 1a there is shown a circuit diagram of a multi-level (five level) transmitter circuit 10 of the prior art. The circuit 10 has an output node 14 for connection to a transducer 12. The transducer 12, can be any type of capacitive transducer, such as ultrasound, MEMS, piezoelectric or any other type of capacitive transducer. The transducer 12 is connected between the output node 14 and ground. The circuit 10 receives as its inputs six input signals having voltages designated as VINP0, VINP1, VINPG, VINNG, VINN1, and VINN0. Four of the six input signals are supplied to a level shifter 20, the details of which are shown in FIG. 2. The level shifter 20 simply shifts the voltage of the input signal to a higher voltage. The input signals VINPG and VINNG are supplied to the circuit 10 directly without going through a level shifter 20.

The circuit 10 has six voltage paths. A first voltage path extends from a voltage source HVP0 to node 14. A second voltage path extends from a voltage source HVP1 to node 14. A third voltage path extends from ground to node 14. A fourth voltage path extends from a voltage source HVN0 to node 14. A fifth voltage path extends from a voltage source HVN1 to node 14. A sixth voltage path extends from ground to node 14.

The first voltage path has a PMOS transistor 22 connected between HVP0 and node 14. The voltage HVP0 is a positive voltage. The transistor 22 is activated by the signal from the output of the voltage level shifter 20a, whose input is the input signal VINP0. The second voltage path has a PMOS transistor 24 connected between HVP1 and a diode 26 to the node 14. The voltage HVP1 is a positive voltage but is less positive than the voltage HVP0. The transistor 24 is activated by the signal from the output of the voltage level shifter 20b, whose input is the input signal VINP1. The third voltage path has a PMOS transistor 28 connected between ground and a diode 30 to the node 14. The transistor 28 is activated by the input signal VINPG. The level shifters 20a and 20b are identical and are shown in FIG. 2.

The fourth voltage path has a NMOS transistor 32 connected between HVN0 and node 14. The voltage HVN0 is a negative voltage. The transistor 32 is activated by the signal from the output of the voltage level shifter 20d, whose input is the input signal VINN0. The fifth voltage path has a NMOS transistor 34 connected between HVN1 and a diode 36 to the node 14. The voltage HVN1 is a negative voltage but is less negative than the voltage HVN0. The transistor 34 is activated by the signal from the output of the voltage level shifter 20c, whose input is the input signal VINN1. The sixth voltage path has a NMOS transistor 38 connected between ground and a diode 40 to the node 14. The transistor 38 is activated by the input signal VINNG. The level shifters 20c and 20d are identical and are shown in FIG. 2.

The difference in the voltage of the voltage sources HVP0, HVP1, Ground, HVN1 and HVN0 is graphically shown in FIG. 1b. This gives rise to the transmitter circuit 10 producing a multi-level output at the node 14.

One of the problems with the circuit 10 of the prior art is that for different voltage input signals, the different voltage outputs at node 14 results, with the output node 14 having different output impedances. Therefore, it is desired that the output impedance for the different output levels should all have approximately the same impedance. One prior art method to avoid impedance mismatch is to use a two level driver with proper termination and complex binary codes. Although the reduction of the number of levels results in reduction in impedance mismatch, and also reduces costs and saves real estate and facilitates design, it comes at the expense of reduction of resolution and penetration of the transducer 12. Hence there is a need to reduce impedance mismatch for a multi-level transmitter circuit.

SUMMARY OF THE INVENTION

A multi-level transmitter circuit with substantially constant output impedance has a capacitive transducer connected between a voltage input and ground. A first voltage path connects the voltage input to a first positive voltage source. The first voltage path is controlled by a first control signal. A second voltage path connects the voltage input to a second positive voltage source, less than the first positive voltage source. The second voltage path passes through a diode and is controlled by a second control signal. A third voltage path connects the voltage input to a third voltage source, less than ground, and is controlled by the second control signal. The impedance at the voltage input during the first control signal is substantially the same as the impedance at the voltage input during the second control signal.

BRIEF DESCRIPTION OF THE DRAWINGS

FIG. 1b is a graph of the voltage levels produced by the transmitter circuit of the prior art shown in FIG. 1a.

FIG. 2 is a circuit diagram of the level shifter circuits used in the transmitter circuit of the prior art shown in FIG. 1a.

DETAILED DESCRIPTION OF THE PREFERRED EMBODIMENT

Figure 1A:
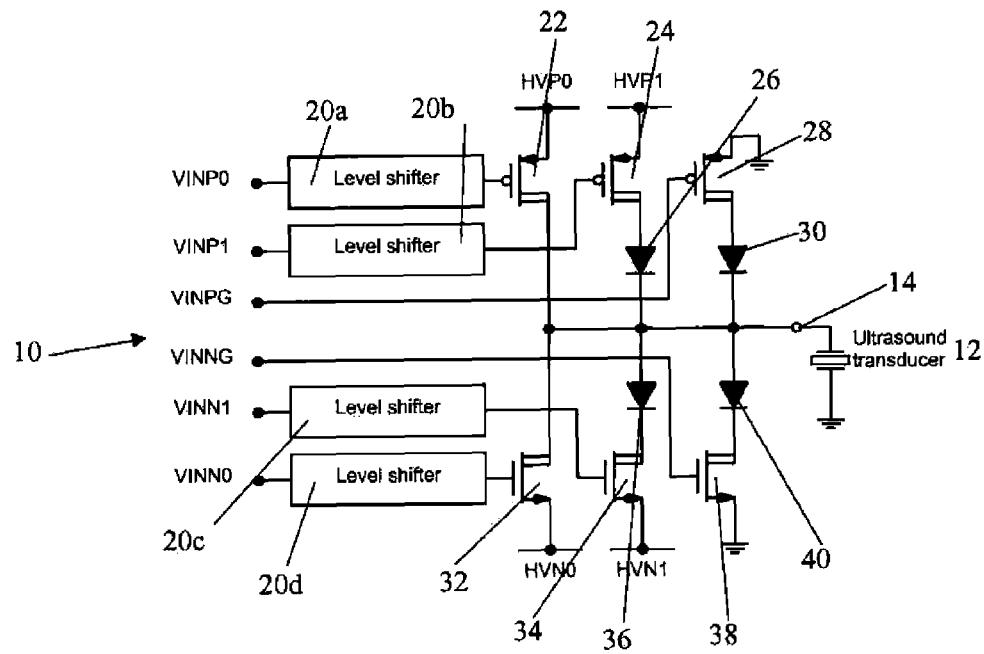
FIG. 1a is a circuit diagram of a multi-level transmitter circuit of the prior art.
Figure 1B:
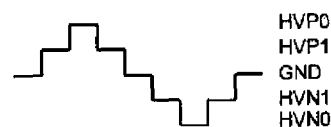
Figure 3:
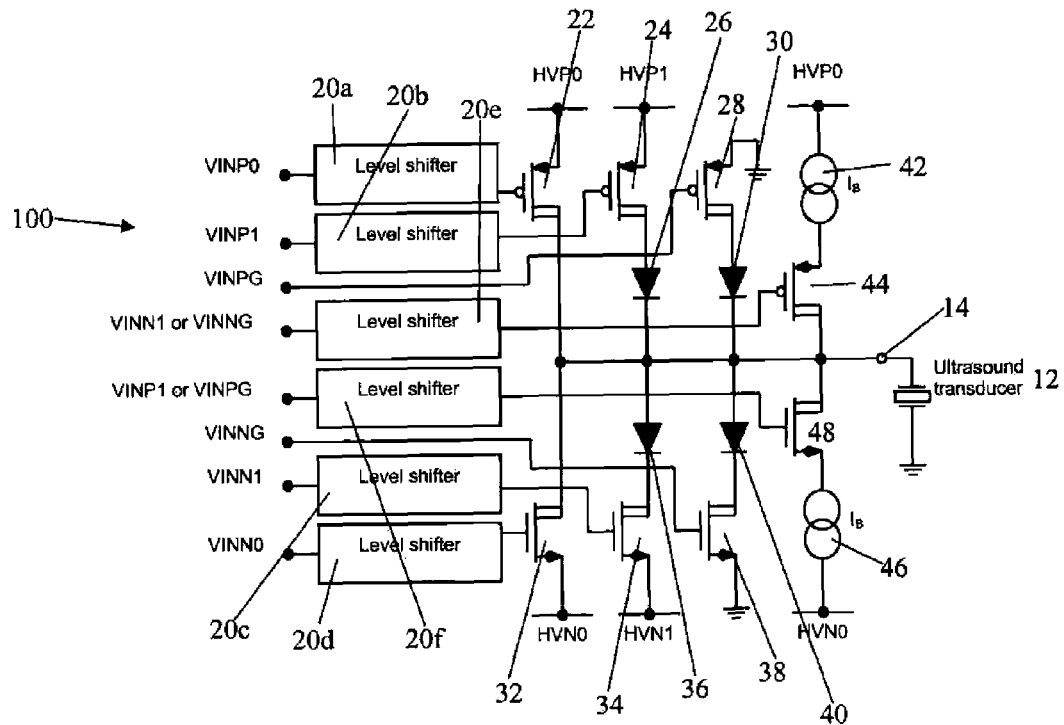
FIG. 3 is a circuit diagram of a multi-level transmitter circuit of the present invention.

Referring to FIG. 3 there is shown a circuit diagram of a multi-level transmitter circuit 100 of the present invention. The circuit 100 is similar to the circuit 10 shown in FIG. 1a, and same numerals will be used for same parts.

Figure 2:
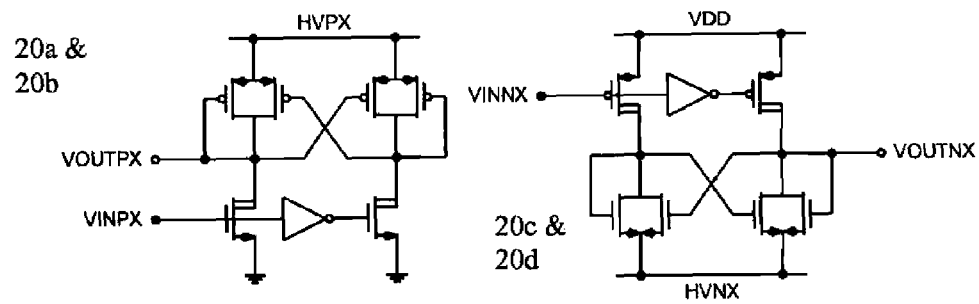

The circuit 100 has a first voltage path that extends from a positive voltage source HVP0 through a PMOS transistor 22 to the output node 14. The transistor 22 is activated by the signal from the output of the voltage level shifter 20a, whose input is the input signal VINP0. The circuit 100 has a second voltage path that extends from a positive voltage source HVP1 through a PMOS transistor 24 through a diode 26 to the output node 14. The voltage HVP1 is less positive than the voltage HVP0. The transistor 24 is activated by the signal from the output of the voltage level shifter 20b, whose input is the input signal VINP1. The circuit 100 has a third voltage path that extends from ground through a PMOS transistor 28 through a diode 30 to the output node 14. The transistor 28 is activated by the signal VINPG. The level shifters 20a and 20b are identical and are shown in FIG. 2.

The circuit 100 has a fourth voltage path that extends from a negative voltage source HVN0 through a NMOS transistor 32 to the output node 14. The transistor 32 is activated by the signal from the output of the voltage level shifter 20d, whose input is the input signal VINN0. The circuit 100 has a fifth voltage path that extends from a negative voltage source HVN1 through a NMOS transistor 34 through a diode 36 to the output node 14. The voltage HVN1 is less negative than the voltage HVN0. The transistor 34 is activated by the signal from the output of the voltage level shifter 20c, whose input is the input signal VINN1. The circuit 100 has a sixth voltage path that extends from ground through a NMOS transistor 38 through a diode 40 to the output node 14. The transistor 38 is activated by the signal VINNG. The level shifters 20c and 20d are identical and are shown in FIG. 2. Each of the diodes 26, 30, 36 and 38 may be any type of diode. However, preferably, the diodes are Schottky diodes which turn off faster than conventional diodes, and decrease the diode drop to 0.5 volts. Finally, a capacitive transducer 12 is connected between the node 14 and ground. Thus far, the structure described is the same as the circuit 10 of the prior art shown in FIG. 1a.

The circuit 100 further comprises a seventh voltage path that extends from the positive voltage source HVP0 through a current source 42, through a PMOS transistor 44 to the output node 14. The transistor 44 is activated by the signal from the output of the voltage level shifter 20e, whose input is either the input signal VINN1 or VINNG. Finally, the circuit 100 comprises an eighth voltage path that extends from the negative voltage source HVN0 through a current source 46, through a NMOS transistor 48 to the output node 14. The transistor 48 is activated by the signal from the output of the voltage level shifter 20f, whose input is either the input signal VINP1 or VINPG. The level shifters 20e and 20f may be the same as that shown in FIG. 2.

In the operation of the circuit 100, during pulsing at the maximum positive amplitude VINP0, the voltage at node 14 is at the highest voltage and is terminated to HVP0 with the on-resistance of transistor 22. Apart from the transistor 22, all other transistors are off and conduct no current. Similarly, during pulsing at the maximum negative amplitude, VINN0, the voltage at node 14 is at the lowest voltage and is terminated to HVN0 with the on-resistance of transistor 32. Apart from transistor 32, all other transistors are off and conduct no current. Thus, during pulsing at the maximum amplitude (positive and negative), the voltage at node 14 is low impedance and can be adjusted to match the impedance of the transducer 12.

When the circuit 100 is pulsing at lower positive amplitude, i.e. VINP1, transistor 24 is turned on. Since transistor 24 is turned on, the current flows from the transducer 12 through the diode 26, turning it on. This causes the voltage at the node 14 to be one diode below HVP1. If the transducer 12 is capacitive, its current will stop after the voltage at node 14 settles down. In case there is no other current flows through the diode 26, it will be turned off and exhibit very high output impedance. Therefore, at the time transistor 24 is turned on, transistor 48 will be turned on and will conduct current Ib. The current comes from transistor 24 through diode 26, causing it to become forward biased. Therefore, the voltage at node 14 will be kept at one diode drop below HVP1 with well-defined impedance. Similarly transistor 34 and transistor 44 will be turned on at the same time during pulsing at the lower negative amplitude of VINN1.

When the circuit 100 is damping to ground from a negative pulse, transistor 28 is turned on. Since transistor 28 is turned on, the current from the transducer 12 flows through the diode 30, turning it on. This causes the voltage at node 14 to be one diode below ground. If the transducer 12 is capacitive, its current will stop after the voltage at node 14 settles down. In case there is no other current flow through the diode 30, it will be turned off and exhibit very high output impedance. Therefore, at the time transistor 28 is turned on, transistor 48 will also be turned on and conducting current Ib. The current comes from transistor 28 through diode 30, causing it to become forward biased. Thus, the voltage at node 14 will be kept at one diode drop below ground with well-defined impedance. Similarly transistors 38 and 44 will be turned on at the same time during damping from a positive pulse.

The circuit 100 of the present invention has a number of advantages compared to the circuit 100 of the prior art. First, the reflection is signal independent. This independence occurs because when the voltage at node 14 settles, the output impedance is closely equal to $n*Vt/Ib+R(on)$, where n is a slope factor, Vt is the thermal voltage, Ib is the current through the current source 42 or 46, and R(on) is the on resistance of the transistor that is turned on. If Ib is large enough, the output impedance is approximately the on resistance of one of the transistors, regardless of the output level. Thus, the output impedance can be approximately the same throughout the range of voltage pulses. A second advantage of the circuit 100 of the present invention is that the settled voltage uncertainty caused by the finite leakage or noise is greatly minimized. Without the current sources 42 and 46, such as the circuit 10 of the prior art, the voltage at the node 14 is only held by the parasitic capacitance of the diode bridge which makes the output terminal sensitive to leakage and noise.

It should be noted in both the circuit 10 of the prior art as well as the circuit 100 of the present invention that the amplitude of the lower positive pulse is limited to one diode drop below HVP1 and that of the lower negative pulse is limited to one diode drop above HVN1. Otherwise, one of the diodes 26 or 36 respectively, will become reverse biased, which exhibits high output impedance. Similarly, the damping output from a negative pulse is limited to one diode drop below ground and that from positive pulse is limited to one diode drop above ground. Otherwise, one of the diodes 30 or 40 will become reverse biased, which exhibits high output impedance.

Finally as previously discussed, the diodes 26, 30, 36 and 40 can all be Schottky diodes, which don't have minority carrier charge storage when they are on, and, thus, turn off faster than regular diodes. Furthermore, the output voltage drop can be reduced by using Schottky diodes, decreasing the diode drop to 0.5V.

Figure 4:
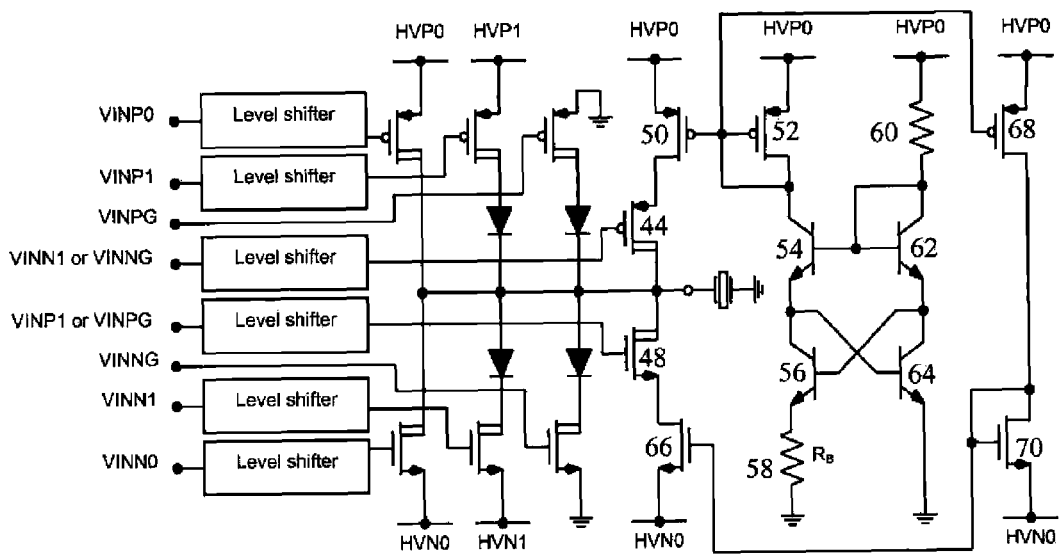
FIG. 4 is a detailed circuit diagram of the embodiment shown in FIG. 3, showing the details of the current source for generating the current Ib.

Referring to FIG. 4 there is shown a detailed circuit diagram of the circuit 100 of the present invention. In particular, the circuit diagram shown in FIG. 4 shows a detailed circuit diagram of the current sources 42 and 46 shown in FIG. 3. The current sources 42 and 46 comprises a PMOS transistor 50 connected in series with the PMOS transistor 44. The source of the PMOS transistor 50 is connected to the positive voltage source HVP0, while the drain of the PMOS transistor 50 is connected to the source of the transistor 44. The gate of the transistor 50 is connected to the gate and the drain of another PMOS transistor 52, whose source is also connected to the positive voltage source HVP0. The drain of the PMOS transistor 52 is connected to the collector of a NPN bipolar transistor 54. The emitter of the bipolar transistor 54 is connected to the collector of another NPN bipolar transistor 56. The emitter of the bipolar transistor 56 is connected through a resistor 58 having resistance of Rb to ground. The emitter of transistor 56 is N times the size of the emitter of the transistor 54. The transistors 52, 54 and 56 connected in series forms a first current path. The collector-base current of transistor 54 is the current Ib. The current sources 42 and 46 has a second current path that forms a current mirror circuit with respect to the first current path. The second current path has a resistor 60, with a first end connected to the positive voltage source HVP0, and a second end connected to the base of the bipolar NPN transistor 54. The second end of the resistor 60 is also connected to the base and collector of another NPN bipolar transistor 62. The emitter of the transistor 62 is cross coupled connected to the base of the transistor 56 and to the collector of a NPN bipolar transistor 64. The base of the transistor 64 is cross coupled to the collector of the transistor 56. The emitter of the transistor 64 is connected to ground. The size of the emitter of each of the transistors 62 and 64 is substantially the same and substantially the same as the size of the emitter of transistor 54. A third current path comprises a PMOS transistor 68 having a source connected to the positive voltage source HVP0 and a drain connected to the drain of a NMOS transistor 70. The gate of the transistor 68 is connected to the gate of the transistors 50 and 52. The source of the transistor 70 is connected to ground. The gate of the transistor 70 is connected to its drain, as well as to the gate of a NMOS transistor 66, whose source is connected to ground and the drain is connected to the source of transistor 48.

It can be shown that the circuit 100 shown in FIG. 4 has the following characteristics:

$$r_d = \frac{nV_T}{I_B} = \frac{nV_T R_B}{nV_T \ln N} = \frac{R_B}{\ln N}$$

where rd is the small signal resistance of diodes 26, 30, 36 and 40, n is the slope factor and Vt is the thermal voltage. The diode small signal resistance can be accurately defined with a physical resistor Rb 58.

From the foregoing it can be seen that the multi-level transmitted circuit of the present invention can generate output signals having approximately the same impedance throughout the range of levels.

What is claimed is:
1. A multi-level transmitter circuit with substantially constant output impedance comprising:
a capacitive transducer connected between a voltage input and ground;
a first voltage path connecting the voltage input to a first positive voltage source, said first voltage path controlled by a first control signal;
a second voltage path connecting the voltage input to a second positive voltage source, less than said first positive voltage source, said second voltage path passing through a diode and controlled by a second control signal; and
a third voltage path connecting the voltage input to a third voltage source, less than ground, and controlled by said second control signal;
whereby the impedance at said voltage input during said first control signal is substantially the same as the impedance at said voltage input during said second control signal.
2. The transmitter circuit of claim 1 further comprising:
a first MOS transistor in said first voltage path between said voltage input and said first positive voltage source, said first control signal controlling the operation of said first MOS transistor.

3. The transmitter circuit of claim 2 further comprising:
a second MOS transistor in said second voltage path between said voltage input and said second positive voltage source, said second control signal controlling the operation of said second MOS transistor.
4. The transmitter circuit of claim 3 further comprising:
a third MOS transistor in said third voltage path between said voltage input and said third voltage source, said second control signal controlling the operation of said third MOS transistor.
5. The transmitter circuit of claim 1, wherein said capacitive transducer is an ultrasound transducer.
6. The transmitter circuit of claim 1, wherein said capacitive transducer is a piezoelectric transducer.
7. The transmitter circuit of claim 1, wherein said capacitive transducer is a MEMS transducer.
8. A circuit, having an output voltage for connection to a transducer, said circuit comprising:
a first voltage path connecting the output voltage to a first positive voltage source, said first voltage path controlled by a first control signal;
a second voltage path connecting the output voltage to a second positive voltage source, less than said first positive voltage source, said second voltage path passing through a first diode and controlled by a second control signal;
a third voltage path connecting the voltage input to the first positive voltage source, and controlled by a fourth control signal;
a fourth voltage path connecting the output voltage to a first negative voltage source, said fourth voltage path controlled by a third control signal;
a fifth voltage path connecting the output voltage to a second negative voltage source, greater than said first negative voltage, said fifth voltage path passing through a second diode and controlled by the fourth control signal;
a sixth voltage path connecting the output voltage to the first negative voltage source, said sixth voltage path controlled by the second control signal.
9. The circuit of claim 8 further comprising:
a first MOS transistor in said first voltage path between said output voltage and said first positive voltage source, said first control signal controlling the operation of said first MOS transistor;
a second MOS transistor in said second voltage path between said output voltage and said second positive voltage source, said second control signal controlling the operation of said second MOS transistor;
a third MOS transistor in said third voltage path between said output voltage and said first positive voltage source, said fourth control signal controlling the operation of said third MOS transistor.
10. The circuit of claim 9, wherein said first, second and third MOS transistors are all PMOS transistors.
11. The circuit of claim 10 further comprising:
a fourth MOS transistor in said fourth voltage path between said output voltage and said first negative voltage source, said third control signal controlling the operation of said fourth MOS transistor;
a fifth MOS transistor in said fifth voltage path between said output voltage and said second negative voltage source, said fourth control signal controlling the operation of said fifth MOS transistor;
a sixth MOS transistor in said sixth voltage path between said output voltage and said first negative voltage source, said second control signal controlling the operation of said sixth MOS transistor.

12. The circuit of claim 11, wherein said fourth, fifth and sixth MOS transistors are all NMOS transistors.

13. The circuit of claim 8 wherein each of said first and second diodes is a Schottky diode.

14. The circuit of claim 8 further comprising:
a seventh voltage path connecting the output voltage to ground, passing through a third diode and controlled by a fifth control signal.

15. The circuit of claim 14 further comprising:
An eighth voltage path connecting the output voltage to ground, passing through a fourth diode and controlled by a sixth control signal.

16. The circuit of claim 15 further comprising:
a first MOS transistor in said first voltage path between said output voltage and said first positive voltage source, said first control signal controlling the operation of said first MOS transistor;
a second MOS transistor in said second voltage path between said output voltage and said second positive voltage source, said second control signal controlling the operation of said second MOS transistor;
a third MOS transistor in said third voltage path between said output voltage and said first positive voltage source, said fourth control signal controlling the operation of said third MOS transistor;
a fourth MOS transistor in said seventh voltage path between said output voltage and said ground, said fifth control signal controlling the operation of said fourth MOS transistor.

17. The circuit of claim 16, wherein said first, second, third and fourth MOS transistors are all PMOS transistors.

18. The circuit of claim 17 further comprising:
a fifth MOS transistor in said fourth voltage path between said output voltage and said first negative voltage source, said third control signal controlling the operation of said fifth MOS transistor;
a sixth MOS transistor in said fifth voltage path between said output voltage and said second negative voltage source, said fourth control signal controlling the operation of said sixth MOS transistor;
a seventh MOS transistor in said sixth voltage path between said output voltage and said first negative voltage source, said second control signal controlling the operation of said seventh MOS transistor; and
an eighth MOS transistor in said eighth voltage path between said output voltage and said ground, said sixth control signal controlling the operation of said eighth MOS transistor.

19. The circuit of claim 18, wherein said fifth, sixth, seventh and eighth MOS transistors are all NMOS transistors.

20. The circuit of claim 19 wherein said third PMOS transistor is also responsive to said sixth control signal.

21. The circuit of claim 20 wherein said seventh NMOS transistor is also responsive to said fifth control signal.

* * * * *